United States Patent
Mirgorodski

(10) Patent No.: US 6,693,010 B1
(45) Date of Patent: Feb. 17, 2004

(54) SPLIT GATE MEMORY CELL WITH A FLOATING GATE IN THE CORNER OF A TRENCH

(75) Inventor: Yuri Mirgorodski, San Jose, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 10/299,740

(22) Filed: Nov. 19, 2002

Related U.S. Application Data

(62) Division of application No. 09/925,662, filed on Aug. 9, 2001, now Pat. No. 6,521,944.

(51) Int. Cl.[7] .................. H01L 21/336; H01L 29/788
(52) U.S. Cl. ................ 438/257; 438/266; 257/315
(58) Field of Search ............... 438/257, 267; 257/315, 321

(56) References Cited

U.S. PATENT DOCUMENTS

| | | | |
|---|---|---|---|
| 4,203,158 A | 5/1980 | Frohman-Bentchkowsky et al. | 365/185 |
| 5,029,130 A | 7/1991 | Yeh | 365/185 |
| 5,045,488 A | 9/1991 | Yeh | 437/43 |
| 5,067,108 A | 11/1991 | Jenq | 365/185 |
| 5,242,848 A | 9/1993 | Yeh | 437/43 |
| 5,278,087 A | 1/1994 | Jenq | 437/43 |
| 5,729,496 A | * 3/1998 | Jung | 365/185.26 |
| 5,753,951 A | * 5/1998 | Geissler | 257/316 |
| 6,051,465 A | * 4/2000 | Kato et al. | 438/258 |
| 6,157,058 A | 12/2000 | Ogura | 257/315 |

OTHER PUBLICATIONS

Technical Paper, "SuperFlash EEPROM Technology," by *Silicon Storage Technology, Inc.*, revised Mar. 1999, 3 pages in length.

Technical Paper, "Technical Comparison of Floating Gate Reprogrammable Nonvolatile Memories," by *Silicon Storage Technology, Inc.*, revised Mar. 1999, 7 pages in length.

* cited by examiner

*Primary Examiner*—Caridad Everhart
*Assistant Examiner*—Calvin Lee
(74) *Attorney, Agent, or Firm*—Stallman & Pollock LLP

(57) ABSTRACT

A memory cell and method for making a memory cell. The memory cell has a floating gate and a control gate, and a source region and a drain region. The structure of the device is such that the area of capacitive coupling between the floating gate and the source region is oriented along a sidewall of a trench formed in a substrate. The drain region is disposed under the bottom of the trench.

5 Claims, 5 Drawing Sheets

SPLIT GATE MEMORY CELL WITH A FLOATING GATE IN THE CORNER OF A TRENCH

This application is a division of U.S. application Ser. No. 09/925,662, filed Aug. 9, 2001 now U.S. Pat. No. 6,521,944.

TECHNICAL FIELD

The present invention relates to an electrically erasable and programmable semiconductor memory device, and to a method of fabricating such a device.

BACKGROUND OF THE INVENTION

Non-volatile reprogrammable semiconductor memory devices are well known in the art. See, for example, U.S. Pat. No. 4,203,158. As shown in the '158 patent, this type of device utilizes charge tunneling between a floating gate and the silicon substrate through a dielectric to program and erase the device. This type of device requires two transistors, a floating gate transistor and a select transistor for each storage site. In this type of memory device, the ability to reduce the cell size can be limited by need to accommodate two transistors per memory cell.

Another type of semiconductor memory device is shown in U.S. Pat. Nos. 5,029,130; 5,045,488; 5,067,108; 5,242,848; and 5,278,087. These patents disclose a structure for a single transistor programmable and erasable memory cell. This structure is often referred to as a split gate cell. This transistor is formed in a substrate of a semiconductor material of a first-conductivity type. Within the substrate are defined source and drain regions with a channel region therebetween. A first insulating layer is disposed over the substrate and over the source, channel and drain regions disposed in the substrate. An electrically conductive floating gate is disposed over the first-insulating layer and extends over a portion of the channel region and over a portion of the source to maximize capacitive coupling between the floating gate and the source. As will be discussed in more detail below, the fact that floating gate is designed to extend over a portion of the source region can operate to restrict the degree to which the cell size can be reduced.

FIG. 1 shows a cross sectional view of a split gate cell memory device of the prior art. Details of the operation and manufacturing of the split gate cell are provided in U.S. Pat. Nos. 5,029,130; 5,045,488; 5,067,108; 5,242,848; and 5,278,087. These patents are incorporated herein by reference.

The split gate cell 100 includes a substrate 120, which can be a P-type silicon substrate. A source region 116 is implanted with ions to be N type. A drain region 114 is implanted with ions to be N type. A channel region 122 is created between the source and the drain. An insulating layer 118 is disposed over the substrate, channel, source and drain. A floating gate, which is composed of a conductive material such as polysilicon, 104 is disposed over the insulating layer 118, such that it is above a portion of the channel 122 and a portion of the source 116. A second insulating layer 110 is disposed adjacent to the floating gate. The second insulating layer has a first portion 112 disposed above the floating gate 104, and second portion 108 disposed adjacent to the floating gate. The control gate 102 is disposed over and adjacent to the floating gate 104, and a portion of the control gate 106 is disposed over a portion of the channel 122. As discussed in the above referenced patents, the floating gate can be formed using a LOCOS field oxidation process, to shape the floating gate so that it has a tip pointing upward toward the control gate. This tip is used to promote efficient tunneling of electrons from the floating gate to the control gate by enhancing the effective electric field on the tip of the floating gate.

As described in the above referenced patents, the cell 100 operates such that when particular voltage differences are applied to the source, drain and control gate, electrons emanating from the drain region are injected on to the floating gate 104, as a result of an abrupt potential drop, to program the device. Further, a different range of voltages can be applied to the device, such that charge travels from the floating gate to the control gate 102 via Fowler-Nordhiem tunneling to erase the device.

Another type of semiconductor memory device is referred to as a stacked gate device. Details regarding the stacked gate device are disclosed in Technical Comparison of Floating Gate Reprogrammable Nonvolatile Memories, *Technical Paper from Silicon Storage Technologies, Revised* March 1999, which is incorporated by reference. In the stacked gate device, the control gate is placed on the top of the floating gate. This configuration can offer an advantage over the split gate cell, because it occupies less space. While the stacked gate device can offer some size reduction advantages over the split gate device, in some aspects of operation, the stacked gate cell is significantly less efficient than the split gate cell. For example, typically, a significant source/drain current is required to program this device, in the range of 1 ma in a standard stacked gate device; as compared with a current of 1 μa in a typical split gate device.

What is needed is a device, and a method for creating a device that has a floating gate, which is shaped to provide for efficient operation, but still provides a configuration which allows for space savings similar to the stacked cell configuration.

SUMMARY

The present invention is directed to a memory cell and a method of making a memory cell that provides for efficient operation, but also allows for the size of the device to be reduced. The method of producing such a memory cell includes the steps of forming a trench in a substrate and covering the surface of the trench with an insulating material. This insulating material is covered with a layer of conductive material, which is then etched to define a floating gate positioned above the bottom of the trench and horizontally aligned with the sidewall of the trench. The floating gate is covered with a second layer of insulating material, and a control gate is formed over the second layer of insulating material. Source and drain regions are disposed in the substrate. The source region is adjacent to a sidewall of the trench, and the drain region is positioned under the bottom of the trench.

The memory cell of the invention is formed in a substrate of semiconductor material. A trench having a sidewall and bottom is disposed in the substrate. A source region is disposed in the substrate adjacent to the sidewall of the trench. This source region is capacitively coupled with a floating gate which is positioned above the bottom of the trench and adjacent to the side wall. The source and drain regions are of a different conductivity type than the substrate. By creating an area of capacitive coupling between the source and the floating gate which is vertically, rather than horizontally, oriented relative to the substrate surface, the horizontal dimension of the memory cell device of the present invention can be reduced relative to the horizontal dimension of a prior art split cell memory device.

The features and advantages of the present invention will be more fully appreciated upon consideration of the following detailed description of the invention and the accompanying drawings, which set forth an illustrative embodiment in which the principles of the invention are utilized.

DETAILED DESCRIPTION OF THE INVENTION

Figure 2:
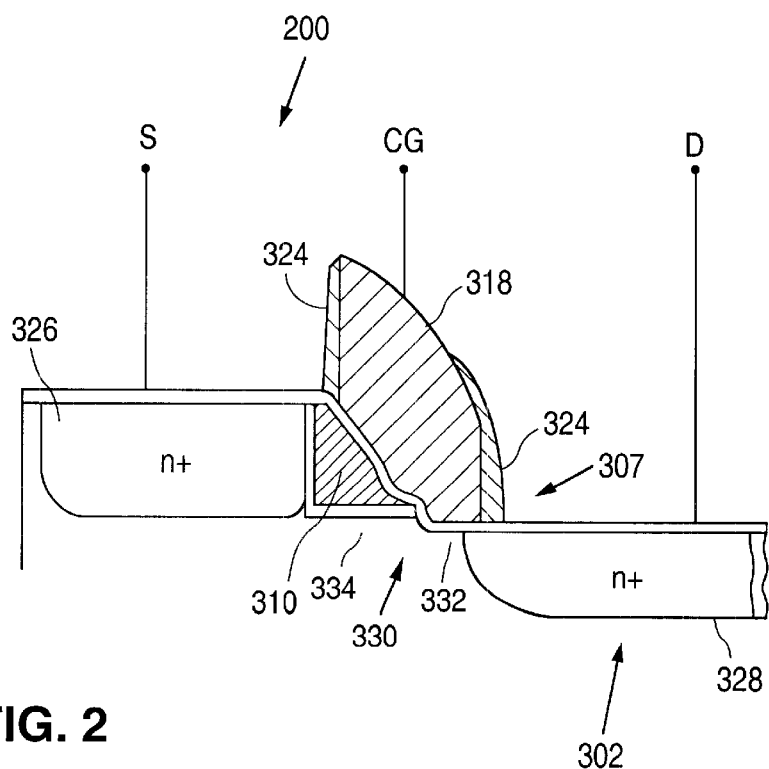
FIG. 2 is a cross sectional side view of a semiconductor memory cell of the present invention.

FIG. 2 shows a side viwe of a memory cell 200 in accordance with the present invention. The cell 200 includes a substrate 302, which can be a P-type silicon substrate. A trench 307 is formed in the substrate 302. An N+ type source region 326 is formed in the substrate 302 to be horizontally adjacent with a vertical sidewall of the trench 307. An N+ type drain region 328 is formed in the substrate 302 under the bottom of the trench 307. A channel region 330 is defined in the substate 302 between the source region 326 and the drain region 328. A conductive floating gate 310 is formed to be horizontally adjacent with the sidewall of the trench 307, and is positioned above bottom of the trench 307. It should be recognized that the sidewall of the trench 307 need not be perpendicular to the surface of the substrate 302; rather, it could be at an inclined angle relative to the surface of the substrate 302. The floating gate 310 is positioned above a portion 334 of the channle region 330. A control gate 318 is position above, but electrically insulated from, the floating gate 310, and above a portion 332 of the channel 330. Spacers 324 are formed adjacent to the control gate 318. More details of the above-described structure will be understood from the following discussion of a preferred method of manufacturing the structure.

Figure 3A:
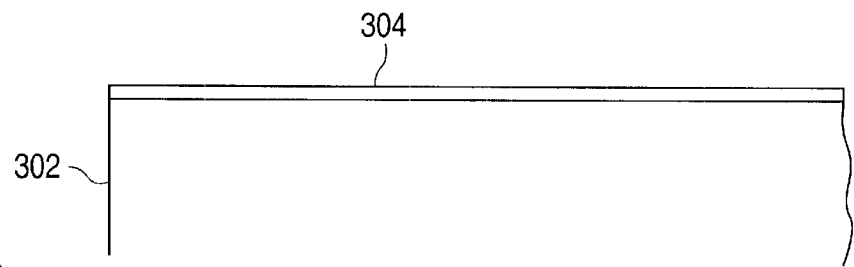
FIGS. 3 (a–n) are cross sectional side views of the memory cell of FIG. 2 showing the steps in a method of making the memory cell of the present invention.

FIG. 3(a) shows a cross-sectional view of a first step of making a memory cell having a floating gate disposed in the corner of a trench. A layer of silicon nitride 304 is formed on the surface of a p-type silicon substrate 302. The silicon nitride layer 304 can be deposited by conventional chemical vapor deposition (CVD) processes. The layer 304 could also be created using other hard mask materials capable of being formed on the substrate 302 using CVD, spinning or other application techniques.

Figure 3B:
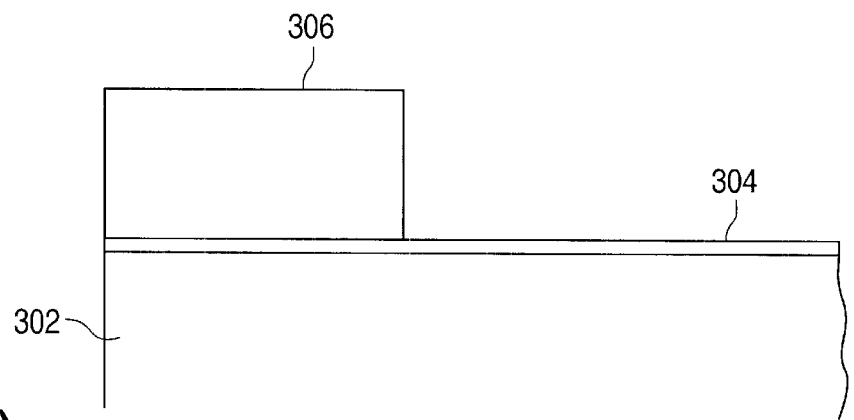
Figure 3C:
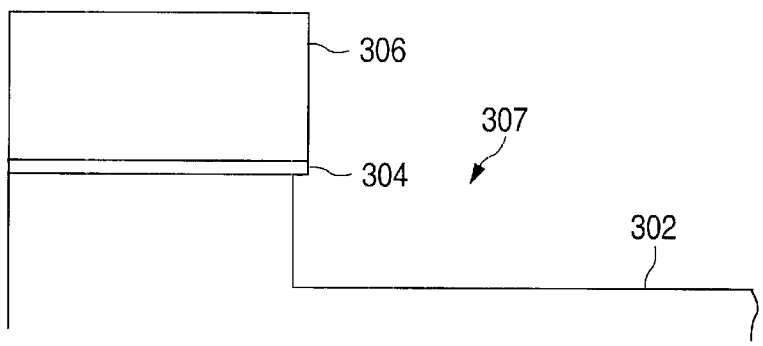
Figure 3D:
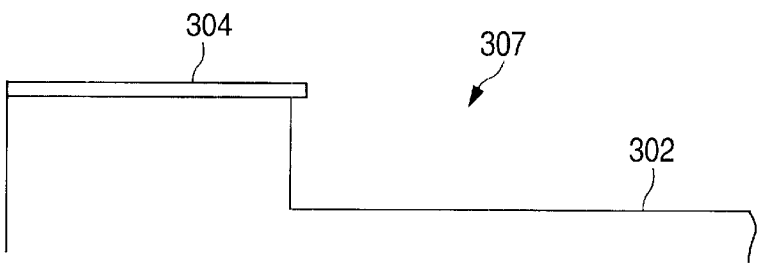

FIG. 3(b) shows a photoresist mask 306 formed on the surface of the silicon nitride 304 , using standard techniques well known to those skilled in the art. The photoresist mask 306 is used to define a region which is etched to form a trench 307 in the surface of the substrate, shown in FIG. 3(c). Typically, the trench depth can be in the range of 0.15–0.3 microns. The forming of the trench 307 can be achieved using conventional etching techniques, such as those which are commonly used to form trenches that are used to provide shallow trench isolation. FIG. 3(d) shows the substrate 302 after the photoresist mask 306 has been removed from the surface of the silicon nitride 304 and the trench 307 is now defined in the substrate.

Figure 3E:
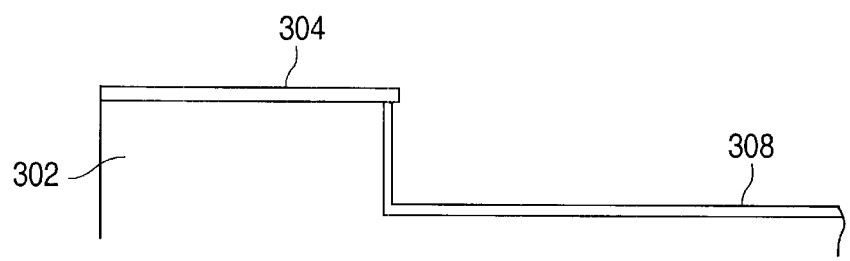

FIG. 3(e) shows the step of forming an oxide layer 308 in the trench 307. Typically, the oxide layer 308 can have a thickness of 50–100 angstroms. This thickness can be varied beyond this range depending on the actual design of the device. Those skilled in the art will recognize that a number of materials can serve as a suitable insulating material including silicon oxynitride, or silicon oxide.

Figure 3F:
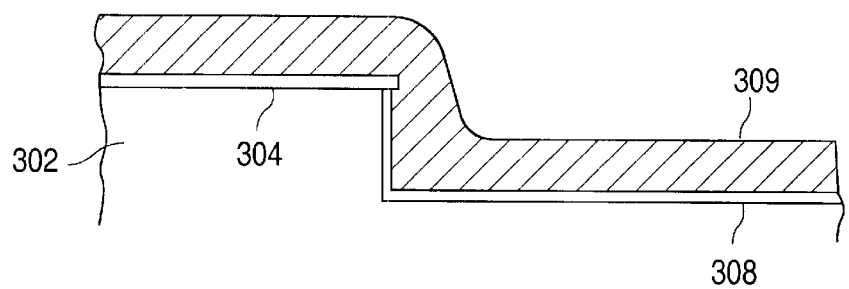

FIG. 3(f) shows the step of forming a first polysilicon layer 309 over the oxide layer 308 and the nitride layer 304. This polysilicon layer 309 can be formed using any number of known techniques including a CVD process. Once the polysilicon layer 309 has been formed, the next step is to etch the polysilicon 309 to remove the undesired portions of the polysilicon layer 309. As is understood in the art, removal of a material via an etching process can be controlled by varying the chemicals used in the etching process. Where a layer of material has been formed over a complex structure, such as over the corner of a trench, a portion of the formed material will remain in the protected area of the corner even after the material has been removed from less protected areas of the structure, such as above the nitride layer 304 and over the portion of the trench bottom not proximate to the trench corner. By varying the chemicals and other aspects of the etching process, the shape of the remaining material can be controlled. The material remaining in the corner of the trench 307 after this etching process forms the polysilicon floating gate 310.

Figure 3G:
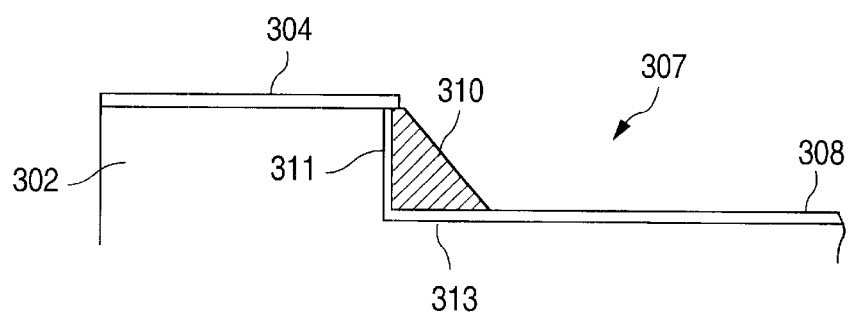
Figure 3H:
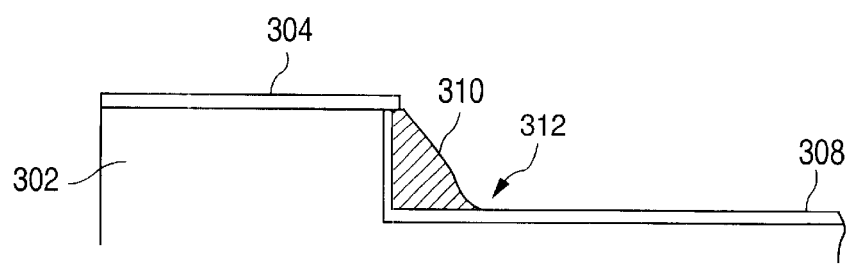

FIG. 3(g) shows the floating gate 310 positioned in the corner of the trench 307. The floating gate is positioned so that it is horizontally aligned with the sidewall 311 of the trench 307 and above the bottom 313 of the trench 307. Note that the oxide layer 308 forms an insulating layer between the sidewall 311 and the bottom 313 of the trench 307 and the floating gate 310. FIG. 3(h) shows the floating gate after a wet oxidation process has been applied to improve the shape of the floating gate so that a tip 312 is formed on the floating gate 310. The etching techniques used to form a triangular shaped polysilicon body are known in the art.

Figure 3I:
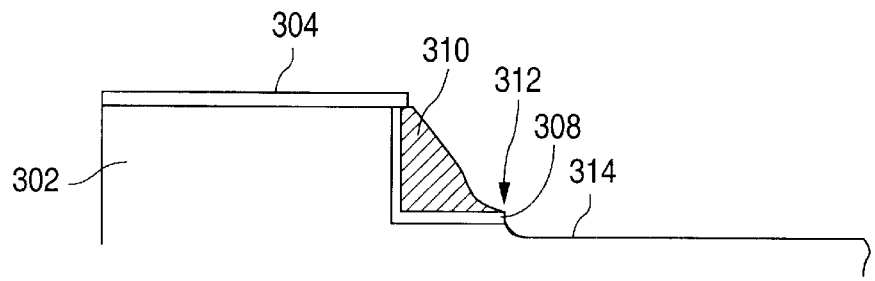

FIG. 3(i) shows the steps which include using an etching process to remove a portion of the oxide 308 which was formed in the trench 307. In conjunction with this step, a further recess 314 can be etched into the bottom of the trench 307. The formation of this additional recess 314 in the trench 307 can facilitate optimum positioning of the control gate relative to the tip 312 of the floating gate 310.

Figure 3J:
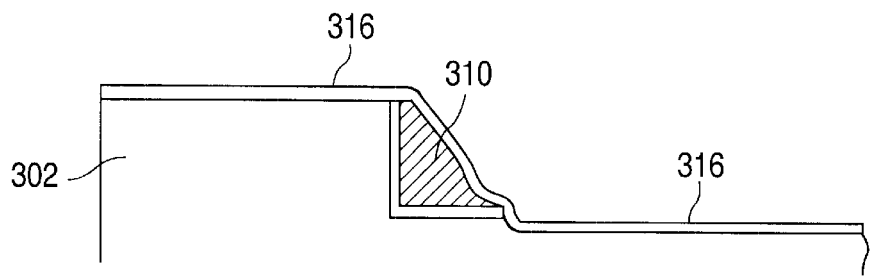

FIG. 3(j) shows the cell after the nitride 304 has been removed from the surface of the substrate 302. After the nitride 304 has been removed, an oxide layer 316 is formed over the surface of the substrate 302 and over the exposed surface of the floating gate 310. This oxide layer 316 serves to insulate the floating gate 310 from the control gate.

Figure 3K:
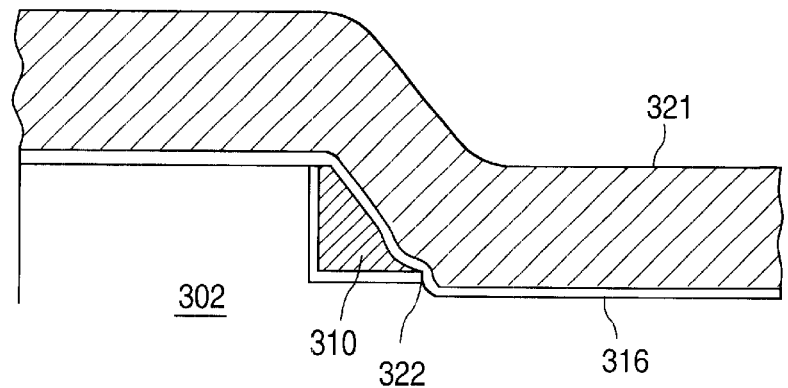
Figure 3L:
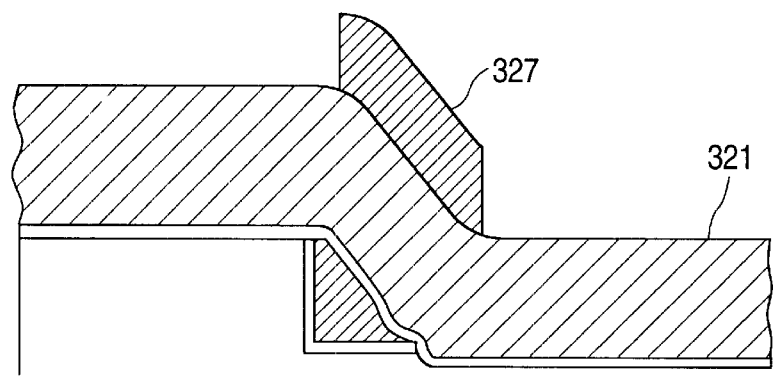

FIG. 3(k) shows the step of forming a conductive layer 321 over the surface of the device. This layer 321 is polysilicon in the preferred embodiment, but other conductive materials could also be used. The layer can be formed using known techniques including CVD. FIG. 3(l) shows the step of forming a photoresist mask 327 over the conductive material layer 321. This mask 327 can be formed using standard photolithographic techniques. Once the mask 327 is formed, the conductive layer 321 is anisotropically etched to form the control gate 318.

Figure 3M:
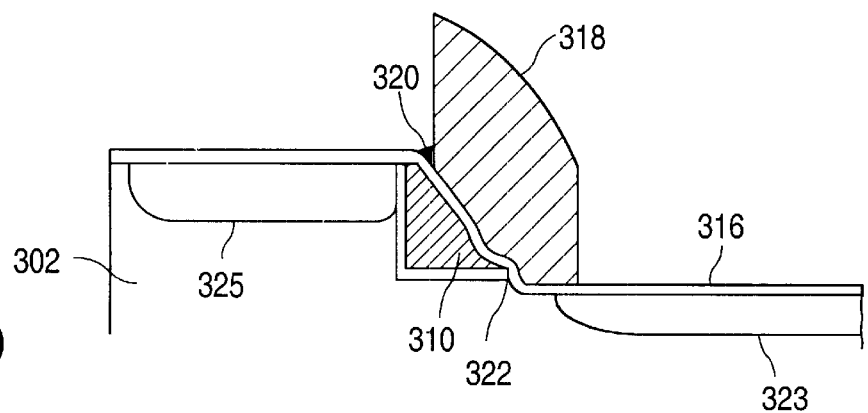

FIG. 3(m) shows the structure of the device after a layer of conductive material 321, such as polysilicon, has been formed on the surface of the device and subsequently etched to form the control gate 318. Depending on the shape of the control gate 318 and the process used, the thickness of the oxide 316 between the control gate 318 and the floating gate 310 can vary from an area 320 to an area 322 which is proximate to the tip of the floating gate 310. The thickness of the oxide 316 can range from 50–200 angstroms with the area adjacent to the tip, while the area 320 can have a distance substantially in excess of 200 angstroms. By making the thickness of the oxide dielectric material 316 thinner in the region of floating gate proximate to the tip 312, relative to thickness of the oxide material 316 proximate to other regions of the floating gate 316, the capacitive coupling between the floating gate 310 and the control gate 318 is minimized which enhances the tunneling of electrons from the floating gate tip 312 to the control gate 318. Substrate regions 323 and 325 can be implanted with ions using standard LDD and HALO implantation techniques.

Figure 3N:
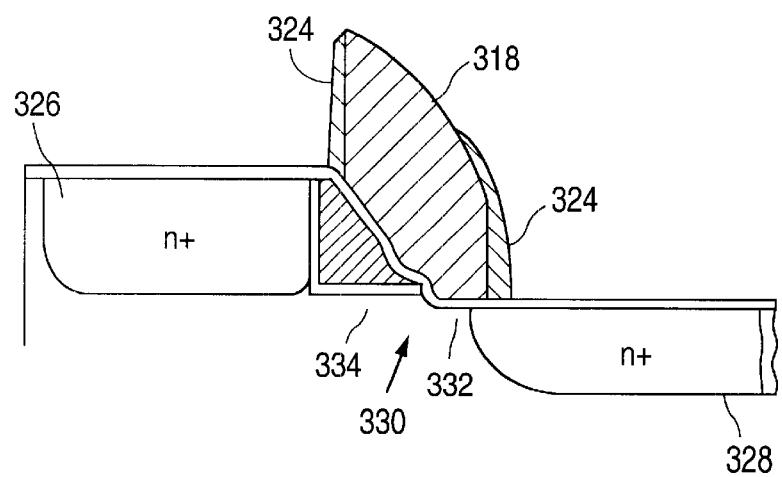

FIG. 3(n) shows the structure of the preferred embodiment of the invention after oxide spacers 324 have been formed on the exposed surfaces of the control gate 318. As one skilled in the art will appreciate, other materials, such as nitride, may also be used to create spacers 324. Once the spacers 324 have been formed, further implantation of ions can be implemented to create the source region 326 of the device and the drain region 328 of the device. Substrate region 330 acts as the channel region between the source 326 and the drain 328. The channel region 330 is composed of two portions. One portion 332 is adjacent to the control gate 318 and the other portion 334 is adjacent to the floating gate 310.

FIG. 2 shows the structure after contacts have been formed to the source, control gate and drain.

OPERATION OF THE MEMORY CELL

Figure 1:
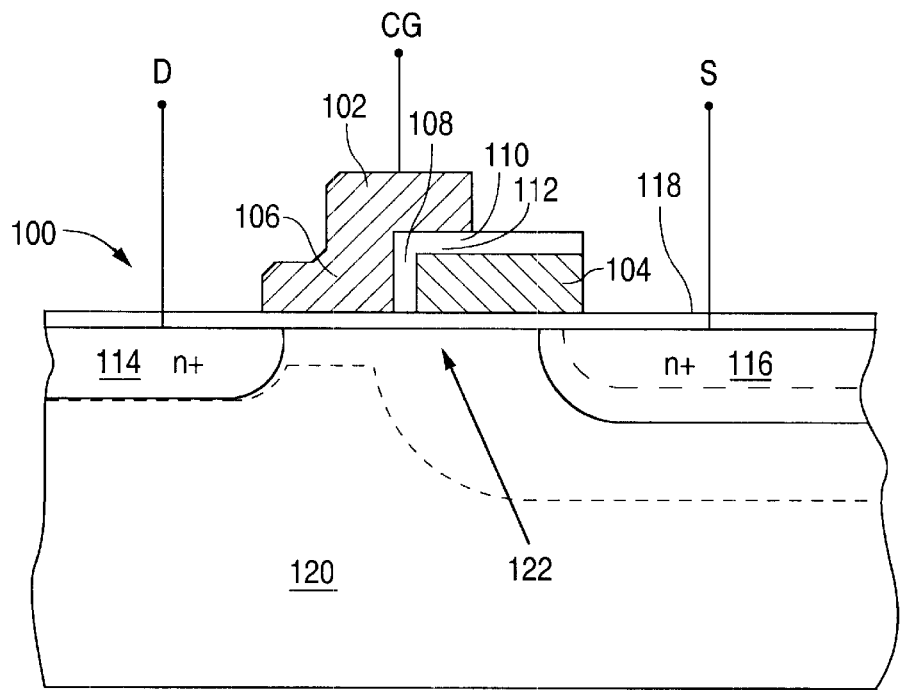
FIG. 1 is cross-sectional side view of a semiconductor memory cell of the prior art.

The operation of the device of the present invention is very similar to the operation of the split gate device shown in FIG. 1. While the operation of the two devices is similar, the present device offers unique advantages. One advantage is that in the preferred embodiment of the device of the present invention, the area of capacitive coupling between the source and the floating gate is vertically oriented along the sidewall 311 of the trench 307. This capacitive coupling is crucial to the operation of the memory cell.

In the split gate device shown in FIG. 1, the area of capacitive coupling between the floating gate and the source is horizontally oriented, so this feature of the device can limit the ability to reduce the horizontal dimension of the device.

In the present invention, the vertical orientation of this capacitive region allows for the horizontal dimension of the device to be significantly reduced. Depending on the particular design implementation this horizontal reduction in size could be as much as 50 percent, as compared with a comparable prior art split gate cell.

In general, the operation of the memory cell device can be thought of in three steps; erase, program, and read. The first step is to erase the device. In the erase mode, a positive voltage is applied to the control gate. Depending on the design of the device, the range of the appropriate voltage can vary. For sake of discussion, an appropriate voltage would be in the range of 10 volts. The source and the drain are brought to ground. The floating gate is capacitively coupled with the source which results in the voltage of the floating gate initially being very close to that of the source, which is signicantly less than the voltage of the control gate. As a result of the potential difference between the floating gate and the control gate, electrons on the floating gate will move from the floating gate to the control gate by the mechanism of Fowler-Nordheim tunneling. This tunneling occurs due to the locally enhanced field on the surface of the floating gate. Due to the shape of the floating gate and the thickness of the oxide between the floating gate and the control gate, most of the electrons will tunnel horizontally from the tip of the floating gate onto the control gate proximate to the tip of the floating gate. After the erase operation has been completed, the floating gate will have a net positive charge because many electrons will have moved from the floating gate to the control gate.

The cell can be programmed as follows. A voltage in the range of approximately 10 volts is applied to the source. The voltage applied to the drain is in the range of approximately 1 volt, and the voltage applied to the control gate is in the range of approximately 2 volts. This creates an electric field which causes current to move through the channel near the surface of the trench. Specifically, electrons will move from the drain toward the source. The voltage in the area of the channel adjacent to the bottom of the control gate will be relatively low. In the area of the channel adjacent to the floating gate, however, there will be a steep increase in voltage. This is due to the fact that there is strong capacitive coupling between the source and the floating gate, along the sidewall of the trench. This capacitive coupling results in the potential of the floating gate initially being relatively close to the potential of the source. As a result of this steep increase in potential between the region 332 of the channel under the control gate 318, and the region 334 of the channel under the floating gate 310, hot electrons are generated, some of which will move from the channel on to the floating gate. Thus, after programming, the floating gate will have a net negative charge as a result of the hot electrons which have moved onto the floating gate.

To read the device, a voltage in the range of approximately 1 volt is applied to the drain, the source is in the range of approximately 0 volts, or ground, and the control gate is brought in the range of approximately two volts. If the floating gate has a net negative charge as a result of being programmed, than the channeled region under the floating gate will be closed and current will not result from the read voltages. If, however, the floating gate has a positive charge due to the device having been erased, then the channel adjacent to the floating gate will be opened and current will result. Thus, depending on the system being used, a current will result in a one and the lack of current will correspond to zero.

Although specific embodiments and methods of the present invention are shown and described herein, this invention is not to be limited by these methods and embodiments. Rather, the scope of the invention is to be defined by the following claims and their equivalents.

What is claimed is:

1. A method of forming a memory device, the method comprising:

forming a trench in a semiconductor substrate, said trench having a bottom and having a sidewall;

covering the trench bottom and sidewall with a first layer of insulating material;

covering the first layer of insulating material with a first layer of conductive material;

etching said first layer of conductive material to define a floating gate positioned above the bottom of the trench and horizontally aligned with the sidewall of the trench;

covering the floating gate with a second layer of insulating material;

covering the second layer of insulating material with a second layer of conductive material;

etching the second layer of conductive material to define a control gate, such that a first portion of the control gate is disposed above the trench bottom with the floating gate interposed between the trench bottom and the first portion of the control gate, and such that a second portion of the control gate is disposed above the trench bottom, and the floating gate is not interposed between the trench bottom and the second portion of the control gate;

creating a source region; and creating a drain region under the bottom of the trench, wherein a channel region is formed under the bottom of the trench, and wherein a first portion of the channel region is under the control gate, and a second portion of the channel is under the floating gate.

2. The method of claim 1 wherein the creating a drain region comprises:

forming a spacer on the control gate; and implanting ions into a region of the substrate under the bottom of the trench.

3. The method of claim 1 wherein the creating a source region comprises:

forming a spacer on the control gate; and implanting ions into a region of the substrate horizontally adjacent to said sidewall.

4. The method of claim 1 wherein the forming of a trench in the substrate further comprises:

forming a mask above said substrate; and using said mask to etch a trench in the substrate.

5. The method of claim 1 wherein the etching said first layer of conductive material to define a floating gate comprises:

controlling etching process parameters to control the shape of the floating gate, such that the tip of the floating gate is proximate to the control gate relative to other regions of the floating gate.

* * * * *